United States Patent
Barrenscheen et al.

(10) Patent No.: US 9,024,794 B2
(45) Date of Patent: May 5, 2015

(54) VIRTUAL ANALOG TO DIGITAL CONVERTER

(71) Applicant: Infineon Technologies AG, Neubiberg (DE)

(72) Inventors: Jens Barrenscheen, Munich (DE); Arno Rabenstein, Singapore (SG); Hans Sulzer, Erding/Langengeisling (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/763,030

(22) Filed: Feb. 8, 2013

(65) Prior Publication Data

US 2013/0214956 A1 Aug. 22, 2013

Related U.S. Application Data

(60) Provisional application No. 61/600,824, filed on Feb. 20, 2012.

(51) Int. Cl.
*H03M 1/12* (2006.01)
*H03M 1/06* (2006.01)

(52) U.S. Cl.
CPC .............. *H03M 1/12* (2013.01); *H03M 1/0678* (2013.01); *H03M 1/1225* (2013.01)

(58) Field of Classification Search
CPC ... H03M 1/205; H03M 1/121; H03M 1/1215; H03M 1/22; H03M 1/225
USPC .......................................................... 341/141
See application file for complete search history.

(56) References Cited

U.S. PATENT DOCUMENTS

| | | | | |
|---|---|---|---|---|
| 5,166,685 | A * | 11/1992 | Campbell et al. ............. | 341/141 |
| 6,653,963 | B1 * | 11/2003 | Barrenscheen et al. ...... | 341/155 |
| 6,788,235 | B1 * | 9/2004 | Barrenscheen et al. ...... | 341/155 |
| 7,420,498 | B2 * | 9/2008 | Barrenscheen ............... | 341/155 |
| 2005/0040978 | A1 * | 2/2005 | Morita et al. ................. | 341/141 |
| 2011/0102221 | A1 * | 5/2011 | Guido et al. .................. | 341/141 |
| 2012/0105261 | A1 * | 5/2012 | Oak .............................. | 341/141 |
| 2013/0201044 | A1 * | 8/2013 | Kawakami et al. ........... | 341/141 |

* cited by examiner

*Primary Examiner* — Howard Williams
(74) *Attorney, Agent, or Firm* — Eschweiler & Associates, LLC

(57) ABSTRACT

The disclosure relates to analog to digital converters, in particular to logical circuit blocks, a system and a method, which provide functionality of an additional analog to digital converter. In accordance with an aspect of the disclosure, there is provided a logical circuit block, which is configured to be connected to a plurality of ADCs each including a plurality of input pins connected to a plurality of analog input channels. The logical circuit block is further configured to cause one ADC of the plurality of ADCs to perform an ADC conversion of an analog input signal received via a particular analog input channel of the plurality of analog input channels to which an input pin of the one ADC is connected.

23 Claims, 1 Drawing Sheet

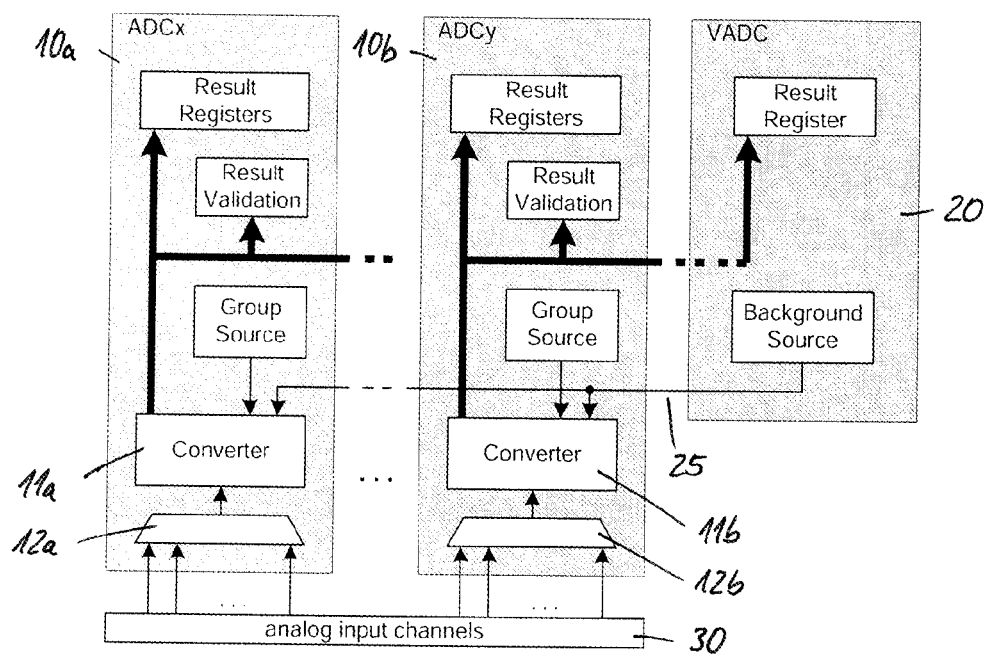

VIRTUAL ANALOG TO DIGITAL CONVERTER

CROSS-REFERENCE TO RELATED APPLICATION

This application claims priority to U.S. Provisional Patent Application 61/600,824 filed on Feb. 20, 2012, entitled "Virtual Analog to Digital Converter", the contents of which are hereby incorporated by reference.

FIELD

The disclosure relates to analog to digital converters, in particular to logical circuit blocks, a system and a method, that provide functionality of an additional analog to digital converter.

BACKGROUND

Microcontrollers often comprise analog to digital converters (ADCs) which convert an analog voltage applied to their input pin to a digital value. In particular, a successive approximation (SAR) ADC comprises an input multiplexer that allows selection of an analog input channel from a plurality of analog input channels connected to the input pins of the ADC.

In many applications, an analog input signal of an input channel may be measured by two different ADCs depending on respective application requirements. In this case, however, the measurement result will fall off in quality.

On the one hand, an ADC input itself represents a load for the analog signal source and, on the other hand, the multiplexer itself represents a capacitance whose charge has to be changed when changing between different input signals. Additionally, leakage current may degrade the measurement result.

An additional error may occur when two ADCs simultaneously measure the same analog signal, e.g. when the two measurements temporarily overlap. Then, the signal source will "see" a doubled load during the overlap, that will degrade the measurement result.

In some specific applications, a large number of analog inputs, e.g. 50 analog inputs, have to be measured by ADCs. In such cases, the large number of inputs is divided between several ADCs to keep the capacitance of the multiplexer small, which also allows to measure more than one signal at a time.

Such applications also often require capability of a background scan, i.e. capability to separately test or scan all or some of the plurality of analog channels. In case this background scan is carried out by means of an additional ADC, the individual analog inputs are connected to two multiplexers (of the two different ADCs) which leads to a degradation of conversion quality. Additionally, a rather complex synchronization of the ADCs would be required to avoid overlap of sampling of the ADCs, i.e. to avoid two ADCs sampling the same signal at the same time. Furthermore, an analog multiplexer having many inputs is rather large and may lead to substantial leakage current.

Therefore, there e.g. exists a need for an apparatus and a method that provide the functionality of an additional ADC while avoiding degradation of conversion quality.

SUMMARY

In accordance with an aspect of the disclosure, there is provided a logical circuit block, which is configured to be connected to a plurality of ADCs each comprising a plurality of input pins connected to a plurality of analog input channels. The logical circuit block is further configured to cause one ADC of the plurality of ADCs to perform an ADC conversion of an analog input signal received via a particular analog input channel of the plurality of analog input channels to which an input pin of the one ADC is connected.

In accordance with a further aspect of the disclosure, there is provided a method comprising sending, by a logical circuit block, a request to one analog digital converter (ADC) of a plurality of ADCs to cause the one ADC to perform an ADC conversion. The method further comprises performing, by the one ADC, the ADC conversion and sending the result of the ADC conversion to the logical circuit block.

Further features, aspects and advantages of the present disclosure will become apparent from the following detailed description of the disclosure made with reference to the accompanying drawings.

BRIEF DESCRIPTION OF THE DRAWING

The accompanying drawing is included to provide a further understanding of the present disclosure and is incorporated in and constitutes a part of this specification. The drawing illustrates an embodiment of the present disclosure and together with the description serves to explain the principles of the disclosure. Other embodiments of the present disclosure and many of the intended advantages of the present disclosure will be readily appreciated as they become better understood by reference to the following detailed description.

FIG. 1 exemplarily shows a simplified schematic diagram of a system according to an embodiment of the disclosure.

DETAILED DESCRIPTION

In the following detailed description, reference is made to the accompanying drawings, which form a part hereof, and in which is shown by way of illustration specific embodiments in which the disclosure may be practiced. It is to be understood that other embodiments may be utilized and structural or other changes may be made without departing from the scope of the present disclosure. The following detailed description, therefore, is not to be taken in a limiting sense, and the scope of the present disclosure is defined by the appended claims.

It is suggested to introduce a "virtual ADC" (VADC) to avoid input multiplexers of multiple ADCs being connected in parallel to the same pin. Such a VADC is not a physical ADC connected in parallel to an input pin, but a logical circuit block that "borrows" input pins or rather input channels from another physical ADC. That is, the VADC requests conversion of analog input signals of a specific analog input channel from an ADC that has an input pin connected to this specific analog input channel.

This approach has two main advantages: On the one hand, an individual analog input channel is only connected to one multiplexer and, on the other hand, the risk of a possible overlap of two conversions that would distort measurement results is eliminated.

FIG. 1 shows a simplified schematic diagram of a system according to an embodiment of the disclosure.

The system depicted in FIG. 1 comprises a plurality of ADCs 10a and 10b, a plurality of analog input channels 30 connected to input pins of the plurality of ADCs 10a and 10b, and a VADC 20 connected to the plurality of ADCs 10a and 10b via connection 25.

Each ADC of the plurality of ADCs 10a and 10b comprises a converter 11a/11b and a multiplexer 12a/12b having its inputs connected to the plurality of analog input channels 30 via respective input pins and its output connected to an input of the converter 11a/11b.

Each ADC of the plurality of ADCs 10a and 10b further comprises a control interface for receiving ADC conversion requests from the VADC 20: The VADC sends a request to one ADC of the plurality of ADCs 10a and 10b that causes the one ADC to perform a requested ADC conversion. The request of the VADC 20 may comprise information identifying one specific analog input channel of the plurality of input channels 30 and cause the one ADC to perform an ADC conversion of analog signals received via the one specific analog input channel that is connected to an input pin of the one ADC.

The ADCs which are connected to a VADC advantageously support a priority scheme. For this, the control interface of each ADC may advantageously comprise programmable priority controlling means configured to decide on the priority of requests, i.e. decide whether VADC requests have a higher or lower priority than requests received directly by the respective ADC.

A background scan of a plurality of analog input channels is one possible application for which the VADC shown in FIG. 1 may advantageously be used. The background scan may include all input channels or a subset of the plurality of input channels. For this, the VADC may comprise circuitry configured to select specific input channels which are to be included in the background scan. With respect to the above-mentioned priority scheme, the requests sent by the VADC to the ADCs when performing a background scan may have a lower priority than requests received directly by the ADCs. Thus, the programmable priority controlling means of an ADC which received two requests in a certain time may cause the ADC to process a request received directly by the ADC prior to a request sent by the VADC.

However, a VADC may be used for many other applications, for example, for handling conversions of analog signals of a great number of input channels. This can be easily accomplished by the VADC requesting the signal conversions from ADCs which are connected to these input channels.

Accordingly, embodiments of the present disclosure allow to implement the functionality of an additional ADC without actually including an additional physical ADC by temporarily "borrowing" input channels from existent ADCs. Such a virtual VADC can be used (and programmed) in the same way as an additional "physical" ADC connected in parallel. However, the VADC, which is a logical block configured to request another ADC to perform a required ADC conversion, obviates the need for an additional ADC connected in parallel to already existing ADCs and also the need for additional multiplexers. Accordingly, the VADC, when employed in a background scan, for example, provides a solution advantageous with respect to chip area and additionally avoiding a loss of ADC conversion quality.

It is also possible to provide a hybrid ADC. A physical ADC having its "own" input pins connected to analog input channels is additionally enabled to "borrow" a number of input pins/channels from other ADCs, i.e. the hybrid ADC can additionally cause another ADC to perform an ADC conversion of analog signals received via an analog input channel connected to an input pin of the other ADC. Thus, the control circuitry of the hybrid ADC can manage or handle more input channels than actually connected to the input pins of the physical ADC by "borrowing" input channels from other ADCs.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A first device, comprising:
a logical circuit block, wherein the logical circuit block is configured to couple to a second device and a third device,
wherein the second device and the third device each comprise an analog to digital converter (ADC) configured to perform a plurality of analog to digital conversions, an ADC result register configured to store results of one or more analog to digital conversion requests from one or more sources that are distinct from the logical circuit block, and a plurality of input pins connected to a plurality of analog input channels,
wherein the logical circuit block of the first device is further configured to send a request to one of the second and third devices to perform a selected analog to digital conversion of an analog input signal received via a particular analog input channel of the plurality of analog input channels to which an input pin of the one of the second and third devices is connected,
wherein the logical circuit block is configured to store the result of the selected analog to digital conversion.

2. The first device of claim 1, wherein the request comprises information identifying the particular analog input channel.

3. The first device of claim 2, wherein the request sent by the logical circuit block has a higher priority than a priority of at least one of the one or more analog to digital conversion requests from the one or more sources that are distinct from the logical circuit block.

4. The first device of claim 2, wherein the request sent by the logical circuit block has a lower priority than a priority of at least one of the one or more analog to digital conversion requests from the one or more sources that are distinct from the logical circuit block.

5. The first device of claim 1, wherein the logical circuit block comprises a logical circuit block result register, wherein the logical circuit block result register is configured to store the result of the selected analog to digital conversion.

6. The logical circuit block of claim 1,
wherein the ADC result registers of the second and third devices are respectively connected to the outputs of the ADCs disposed within each of the second and third devices, respectively.

7. The first device of claim 1, wherein the ADC result register of the first device and the ADC result register of the second device are configured to only store results of the one or more analog to digital conversion requests from the one or more sources that are distinct from the logical circuit block.

8. A system, comprising:
a logical circuit block comprising a logical circuit block result register;
a first analog to digital conversion device, comprising:
a first analog to digital converter (ADC) comprising a first control interface;
a first plurality of input pins configured to be connected to a first subset of a plurality of analog input channels; and a first ADC result register configured to store one or more analog to digital conversion results of the first ADC; and a second analog to digital conversion device, comprising:
a second ADC comprising a second control interface;
a second plurality of input pins configured to be connected to a second subset of the plurality of analog input channels; and
a second ADC result register configured to store one or more analog to digital conversion results of the second ADC, wherein the logical circuit block is connected to the first and second analog to digital conversion devices and is configured to send a first request for a first analog to digital conversion of a particular analog input channel from a selected one of the first and second analog to digital conversion devices that has an input pin configured to be connected to the particular analog input channel, wherein the selected one of the first and second analog to digital conversion devices is configured to receive a second request for a second analog to digital conversion, wherein the selected one of the first and second analog to digital conversion devices is configured to perform, in response to the first request, the first analog to digital conversion on the particular analog input channel and to transmit a first result of the first analog to digital conversion on the particular analog input channel to the logical circuit block, and wherein the selected one of the first and second analog to digital conversion devices is configured to perform, in response to the second request, the second analog to digital conversion, and to store a second result of the second analog to digital conversion in the ADC result register of the selected one of the first and second analog to digital conversion devices.

9. The system of claim 8, wherein the first request comprises information identifying the particular analog input channel.

10. The system of claim 9, wherein each of the first and second control interfaces comprise programmable priority controlling means configured to decide which request of two received requests has a higher priority, wherein the two received requests include the request sent by the logical circuit block and another request for additional analog to digital conversion.

11. The system of claim 8, wherein the logical circuit block of the first device is further configured to store the result of the analog to digital conversion on the particular analog input channel in the logical circuit block result register.

12. The system of claim 8, wherein the logical circuit block is further configured to perform a background scan of at least a third subset of the plurality of analog input channels.

13. The system of claim 8, wherein the result registers of each of the second and third devices are respectively connected to the outputs of analog to digital converters disposed within each of the second and third devices, respectively.

14. A system, comprising:
a first device, a second device, and a third device each comprising a result register configured to store a result of an analog to digital conversion, the second and third devices each comprising a converter, and the first device not comprising a converter; and
wherein the first device of the plurality of devices comprises a logical circuit block which is connected to the second and third devices and is configured to test a particular analog input channel by requesting an analog to digital conversion of the particular analog input channel from a selected one of the second and third devices that has an input pin configured to be connected to the particular analog input channel when the analog to digital conversion request of the particular analog input channel originating from the logical circuit block of the first device does not collide with an analog to digital conversion request of the particular analog input channel originating from the second or third device.

15. The system of claim 14, wherein the logical circuit block of the first device is further configured to send a request to a control interface of the selected one of the second and third devices to cause the second device to perform the requested analog to digital conversion wherein the request comprises information identifying the particular analog input channel.

16. The system of claim 15, wherein a control interface of the selected one of the second and third devices comprises programmable priority controlling means configured to decide which request of two received requests has a higher priority, wherein the two received requests include the request sent by the logical circuit block and another request for an analog to digital conversion received by the selected one of the second and third devices.

17. The system of claim 14, wherein the logical circuit block of the first device is further configured to receive a result of the ADC conversion performed by the selected one of the second and third devices.

18. The system of claim 14, wherein the logical circuit block of the first device is further configured to perform a background scan of at least a subset of the plurality of analog input channels to which the pluralities of input pins of the second and third devices are connected.

19. A method, comprising:
sending, by a logical circuit block of a first device, an external request to one analog to digital converter of a selected one of a second device and a third device each comprising a result register, wherein the external request causes the one of the second and third device to perform an analog to digital conversion;
sending, by the selected one of the second device and the third device, an internal request to an analog to digital converter of the selected one of the second device and the third device, respectively, wherein the internal request causes the selected one of the second and third device to perform a first analog to digital conversion;
receiving, at the selected one of the second device and the third device, an additional request to perform a second analog to digital conversion;
performing, by the selected one of the second and the third device, the second analog to digital conversion based on the additional request;
storing the result of the second analog to digital conversion in a result register of the selected one of the second device and the third device;
performing, by the selected one of the second and the third device, the first analog to digital conversion based on the external request; and
sending the result of the first analog to digital conversion to the logical circuit block of the first device.

20. The method of claim 19, wherein the request comprises information identifying a particular analog input channel and the selected one of the second and third devices is caused to perform an analog to digital conversion of analog input signals received via the particular analog input channel connected to an input pin of the selected one of the second and third devices.

21. The method of claim 19, further comprising performing, by the logical circuit block of the first device, a background scan of at least a subset of a plurality of analog input channels to which the second and third devices are connected.

22. The method of claim 21, wherein the request sent by the logical circuit block of the first device has a lower priority than a priority of the additional request.

23. A system, comprising:
a first device, comprising:
  a first analog to digital converter (ADC);
  a first result register; and
  a first input multiplexer having a first plurality of input pins connected to a first plurality of analog input channels,
  wherein the first device is configured to provide a first internal analog to digital conversion request to the first ADC, wherein the first ADC is configured to perform a first internal analog to digital conversion in response to the first internal analog to digital conversion request, and wherein the first result register is configured to store a result of the first internal analog to digital conversion;
a second device, comprising:
  a second ADC;
  a second result register; and
  a second input multiplexer having a second plurality of input pins connected to a second plurality of analog input channels different than the first plurality of analog input channels,
  wherein the second device is configured to provide a second internal analog to digital conversion request to the second ADC, wherein the second ADC is configured to perform a second internal analog to digital conversion in response to the second internal analog to digital conversion request, and
  wherein the second result register is configured to store a result of the second internal analog to digital conversion; and
a third device, comprising a logical circuit block connected to the first and second ADCs and configured to provide an external analog to digital conversion request to a selected one of the first and second analog to digital converters,
wherein, in response to the external analog to digital conversion request, the selected one of the first and second ADCs is configured to perform an external analog to digital conversion of an analog input signal received via a particular analog input channel of the first or second plurality of analog input channels to which an input pin of the one of the first and second analog to digital converters is connected,
wherein the selected one of the first and second ADCs is configured to send the result of the external analog to digital conversion to the third device.

* * * * *